(12) United States Patent  
Xu (10) Patent No.: US 10,453,392 B2  
(45) Date of Patent: Oct. 22, 2019

(54) PIXEL CIRCUIT AND DISPLAY DEVICE HAVING THE SAME

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventor: Yingsong Xu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

(*) Notice: Subject to any disclaimer, the term of this patent is extended or adjusted under 35 U.S.C. 154(b) by 0 days.

(21) Appl. No.: 15/756,973

(22) PCT Filed: Jun. 8, 2017

(86) PCT No.: PCT/CN2017/087544  
§ 371 (c)(1),  
(2) Date: Mar. 1, 2018

(87) PCT Pub. No.: WO2018/161463  
PCT Pub. Date: Sep. 13, 2018

(65) Prior Publication Data  
US 2019/0057648 A1    Feb. 21, 2019

(30) Foreign Application Priority Data  
Mar. 7, 2017 (CN) .......................... 2017 1 0131262

(51) Int. Cl.  
*G09G 3/36* (2006.01)  
*G09G 3/3233* (2016.01)  
(Continued)

(52) U.S. Cl.  
CPC ......... *G09G 3/3233* (2013.01); *G09G 3/3266* (2013.01); *G09G 3/3275* (2013.01);  
(Continued)

(58) Field of Classification Search  
CPC . G09G 3/36; G09G 5/00; G11C 19/00; G02F 1/1345; G06F 3/038  
See application file for complete search history.

(56) References Cited

U.S. PATENT DOCUMENTS

2009/0109148 A1   4/2009  Tokuda et al.  
2012/0169954 A1*  7/2012  Liu .................. G09G 3/3611  
                                                            349/38  
(Continued)

FOREIGN PATENT DOCUMENTS

CN         1567422 A     1/2005  
CN       101425532 A     5/2009  
(Continued)

OTHER PUBLICATIONS

Office Action received for Chinese Patent Application No. 201710131262.5, dated Mar. 5, 2018, 9 pages (3 pages of English Translation and 6 pages of Office Action).  
(Continued)

Primary Examiner — Pegeman Karimi  
(74) Attorney, Agent, or Firm — Womble Bond Dickinson (US) LLP (57) ABSTRACT

A pixel circuit is disclosed that includes an organic light-emitting diode, a driving transistor connected in series with the organic light-emitting diode and having a gate connected to a first node and a drain connected to a second node, a dual-gate transistor coupled between the first node and the second node, and a leakage current suppression structure for suppressing a change in a driving current of the organic light-emitting diode caused by a leakage current flowing  
(Continued)

through the dual-gate transistor. A display device having the pixel circuit is also disclosed.

18 Claims, 5 Drawing Sheets

(51) Int. Cl.
*H01L 27/32* (2006.01)
*G09G 3/3266* (2016.01)
*G09G 3/3275* (2016.01)

(52) U.S. Cl.
CPC . *H01L 27/3262* (2013.01); *G09G 2300/0819* (2013.01); *G09G 2300/0861* (2013.01); *G09G 2310/0251* (2013.01); *G09G 2310/0262* (2013.01); *G09G 2320/0219* (2013.01); *G09G 2320/0233* (2013.01)

(56) References Cited

U.S. PATENT DOCUMENTS

2016/0379571 A1* 12/2016 Kim ............... G09G 3/3233 345/215
2018/0053795 A1* 2/2018 Lan ............... G02F 1/13624
2018/0151650 A1* 5/2018 Ha ............... G09G 3/3233

FOREIGN PATENT DOCUMENTS

| | | |
|---|---|---|
| CN | 103050080 A | 4/2013 |
| CN | 103123773 A | 5/2013 |
| CN | 106297659 A | 1/2017 |
| KR | 10-0795810 B1 | 1/2008 |

OTHER PUBLICATIONS

International Search Report received for PCT Patent Application No. PCT/CN2017/087544, dated Dec. 7, 2017, 9 pages (3 pages of English Translation and 6 pages of Original Document).
Written Opinion received for PCT Patent Application No. PCT/CN2017/087544, dated Dec. 7, 2017, 4 pages of Original Document Only.
Office Action received for Chinese Patent Application No. 201710131262.5, dated Sep. 18, 2018, 12 pages (6 pages of English Translation and 6 pages of Office Action).

* cited by examiner (PRIOR ART)

PIXEL CIRCUIT AND DISPLAY DEVICE HAVING THE SAME

CROSS-REFERENCE TO RELATED APPLICATIONS

The present application is the U.S. national phase entry of PCT/CN2017/087544, with an international filing date of Jun 8, 2017, which claims the benefit of Chinese Patent Application No. 201710131262.5, filed on Mar. 7, 2017, the entire disclosures of which are incorporated herein by reference.

TECHNICAL FIELD

The disclosure relates to the field of display technology, and in particular to a pixel circuit and a display device having the pixel circuit.

BACKGROUND

Various compensation techniques have been applied to active matrix organic light-emitting diode (AMOLED) pixel circuits in order to compensate for the non-uniformity of threshold voltage of the driving transistors due to the process.

Figure 1:
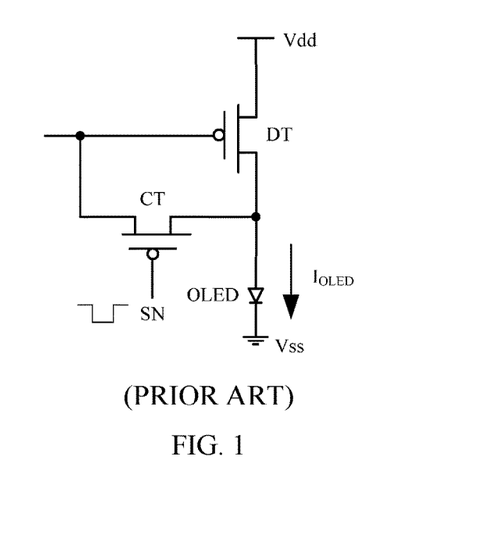
FIG. 1 is a schematic diagram showing a compensation technique for an AMOLED pixel circuit.

FIG. 1 is a schematic diagram showing a compensation technique for an AMOLED pixel circuit. As shown in FIG. 1, the source of a driving transistor DT is connected to a first power supply voltage Vdd, an organic light-emitting diode (OLED) is connected between the drain of the driving transistor DT and a second power supply voltage Vss, and a compensation transistor CT is connected between the gate and the drain of the driving transistor DT. When the gate of the compensation transistor CT is applied with a low level signal SN, the compensation transistor CT is turned on to cause the driving transistor DT to form a diode structure. This diode structure can be used to compensate for the influence of the threshold voltage Vth of the driving transistor DT on the driving current $I_{OLED}$ supplied by the driving transistor DT to the OLED.

When the driving transistor DT forms the diode structure, its gate voltage Vg is equal to its drain voltage Vd, and the difference Vds between the drain voltage Vd and the source voltage Vs satisfies Vds=Vth. Accordingly, it can be derived in the example of FIG. 1 that Vg=Vd=Vds+Vs=Vth+Vdd. As can be seen, the threshold voltage Vth of the driving transistor DT has been introduced into the gate voltage Vg.

In a subsequent light emission phase, the drive current $I_{OLED}$ can be calculated as:

$$I_{OLED} = K(Vgs - Vth)^2 \quad (1)$$

where K represents a constant value determined by the mobility of the driving transistor DT and the parasitic capacitance, and Vgs represents the difference between the gate voltage Vg and the source voltage Vs of the driving transistor DT. During this light emission phase, the compensation transistor CT is turned off and the data voltage has been introduced into Vg so that the threshold voltage Vth is canceled out in equation (1). In other words, the driving current $I_{OLED}$ will be independent of the threshold voltage Vth, thus improving the uniformity of luminance across individual OLEDs.

However, a leakage current flowing through the compensation transistor CT causes a change in the gate voltage Vg of the driving transistor DT when the compensation transistor CT is turned off. This may, for example, result in a change in the driving current $I_{OLED}$ during the light emission phase, thus affecting the display quality.

SUMMARY

It is advantageous to use a dual-gate transistor, which includes two sub-transistors connected in series via a common terminal, as a compensation transistor CT in that the dual-gate transistor can have a smaller leakage current than a normal transistor. However, the common terminal of the dual-gate transistor is often floated, rendering the operation of such a pixel circuit susceptible to external disturbance. For example, an undesired turn-on of the dual-gate transistor due to external disturbance may result in incorrect data voltage writing. As another example, an increased leakage current of the dual-gate transistor may be caused during the light emission phase, causing a change in the magnitude of the driving current $I_{OLED}$ flowing through the OLED.

It would therefore be advantageous to achieve a pixel circuit that mitigates, alleviates or eliminates one or more of the above problems. It would also be desirable to provide a display device having such pixel circuits.

According to a first aspect of the present disclosure, a pixel circuit is provided comprising an organic light-emitting diode; a driving transistor connected in series with the organic light-emitting diode and configured to drive the organic light-emitting diode to emit light by means of a driving current flowing through the organic light-emitting diode during a light emission phase, wherein the driving transistor has a gate connected to a first node and a drain connected to a second node; a dual-gate transistor coupled between the first node and the second node to cause the driving transistor to form a diode structure when the dual-gate transistor is turned on, wherein the dual-gate transistor comprises two sub-transistors connected in series via a common terminal; and a leakage current suppression structure for suppressing a change in the driving current caused by a leakage current flowing through the dual-gate transistor.

In some embodiments, the leakage current suppression structure comprises at least one of a capacitor coupled between the first node and the common terminal or a Schottky diode coupled between the first node and the dual-gate transistor. The Schottky diode is arranged to be reversely turned off to suppress flowing of the leakage current through the dual-gate transistor during the light emission phase.

In some embodiments, the dual-gate transistor comprises an active layer; an insulation layer arranged on the active layer; a gate metal layer arranged on the insulation layer and comprising two gate metal regions spaced apart from and electrically connected to each other; a first electrode in electrical contact with the active layer and connected to the first node; and a second electrode in electrical contact with the active layer and connected to the second node.

In some embodiments, the capacitor comprises a metal plate arranged such that the insulation layer is sandwiched between the metal plate and the active layer.

In some embodiments, the metal plate is located in a different layer than the gate metal layer.

In some embodiments, the metal plate is located in a same layer as the gate metal layer.

In some embodiments, the first electrode is made of a metal, and the Schottky diode comprises a hole blocking layer formed by metal-semiconductor contact between the first electrode and the active layer.

In some embodiments, the active layer is made of polysilicon, and the metal is selected from the group consisting of Ag, Au, Pt, and Al.

In some embodiments, the two sub-transistors each have a gate connected to a first scan line, and the pixel circuit further comprises a storage capacitor having a first terminal connected to the first node and a second terminal connected to a third node; a third transistor connected between the driving transistor and the organic light-emitting diode and having a gate connected to a light emission control line; a fourth transistor having a gate connected to a second scan line, a first electrode connected to an initialization voltage, and a second electrode connected to the first node; a fifth transistor having a gate connected to the second scan line, a first electrode connected to a first power supply voltage, and a second electrode connected to the third node; a sixth transistor having a gate connected to the first scan line, a first electrode connected to a data line, and a second electrode connected to the third node; and a seventh transistor having a gate connected to the light emission control line, a first electrode connected to a reference voltage, and a second electrode connected to the third node.

In some embodiments, the fourth transistor is configured to initialize a potential at the first node to the initialization voltage in response to a second scan signal from the second scan line, and the fifth transistor is configured to initialize a potential at the third node to the first power supply voltage in response to the second scan signal.

In some embodiments, the dual-gate transistor is configured to cause the driving transistor to form the diode structure in response to a first scan signal from the first scan line, and the sixth transistor is configured to write a data voltage from the data line to the third node in response to the first scan signal.

In some embodiments, the seventh transistor is configured to transfer the reference voltage to the third node in response to a light emission control signal from the light emission control line, and the third transistor is configured to, responsive to the light emission control signal, provide a current path along which the drive current flows through the organic light-emitting diode.

According to another aspect of the disclosure, a display device is provided comprising a pixel array comprising a plurality of pixel circuits; a first scan driver configured to supply scan signals to the pixel array; a second scan driver configured to supply light emission control signals to the pixel array; and a data driver configured to supply data signals to the pixel array. Each of the plurality of pixel circuits comprises an organic light-emitting diode; a driving transistor connected in series with the organic light-emitting diode and configured to drive the organic light-emitting diode to emit light by means of a driving current flowing through the organic light-emitting diode during a light emission phase, wherein the driving transistor has a gate connected to a first node and a drain connected to a second node; a dual-gate transistor coupled between the first node and the second node to cause the driving transistor to form a diode structure when the dual-gate transistor is turned on, wherein the dual-gate transistor comprises two sub-transistors connected in series via a common terminal; and a leakage current suppression structure for suppressing a change in the driving current caused by a leakage current flowing through the dual-gate transistor.

These and other aspects of the present disclosure will be apparent from and elucidated with reference to the embodiment(s) described hereinafter.

BRIEF DESCRIPTION OF THE DRAWINGS

Further details, features, and advantages of the disclosure are disclosed in the following description of exemplary embodiments with reference to the accompanying drawings, in which.

DETAILED DESCRIPTION

The disclosure will now be described more fully hereinafter with reference to the accompanying drawings, in which exemplary embodiments of the disclosure are shown. The present disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements.

The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
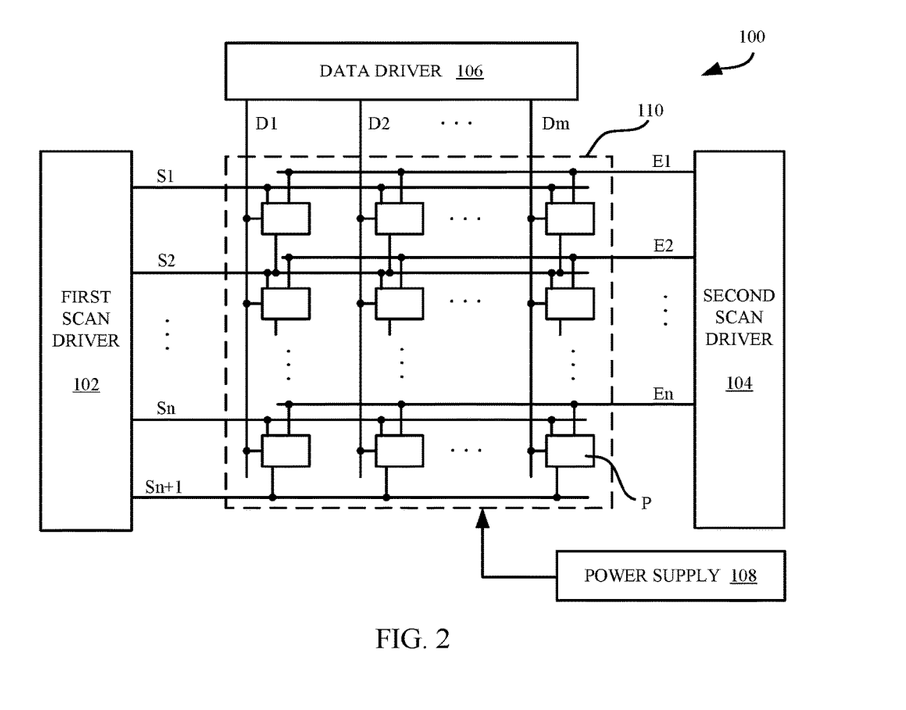
FIG. 2 is a schematic diagram of a display device according to an embodiment of the present disclosure.

FIG. 2 is a schematic diagram of a display device 100 according to an embodiment of the present disclosure. Referring to FIG. 2, the display device 100 includes a pixel array 110, a first scan driver 102, a second scan driver 104, a data driver 106, and a power supply 108.

The pixel array 110 includes n×m pixel circuits P. Each pixel circuit P includes an OLED. The pixel array 110 includes n+1 scan lines S1, S2, . . . , Sn+1 arranged in a row direction to transfer scan signals, m data lines D1, D2, . . . , Dm arranged in a column direction to transfer data signals, n light emission control lines E1, E2, . . . , En arranged in the row direction to transfer light emission control signals, and m first wires (not shown) and m second wires (not shown) for applying the first and second power supply voltages Vdd and Vss. n and m are natural numbers. The pixel array 110 causes the OLEDs (not shown) to emit light so as to display an image by using signals including the scan signals, the data signals, and the light emission control signals.

The first scan driver 102 is connected to the scan lines S1, S2, . . . , Sn+1 to apply the scan signals to the pixel array 110.

The second scan driver 104 is connected to the light emission control lines E1, E2, . . . , En to apply the light emission control signals to the pixel array 110.

The data driver 106 is connected to the data lines D1, D2, . . . , Dm to apply the data signals to the pixel array 110. Here, the data driver 106 supplies the data signals to the pixel circuits P in the pixel array 110 during data writing.

The power supply 108 applies the first power supply voltage Vdd and the second power supply voltage Vss to each of the pixel circuits P in the pixel array 110.

The display device 100 can be any product or component having a display function, such as a mobile phone, a tablet, a television, a monitor, a notebook computer, a digital photo frame, a navigator and the like.

Figure 3:
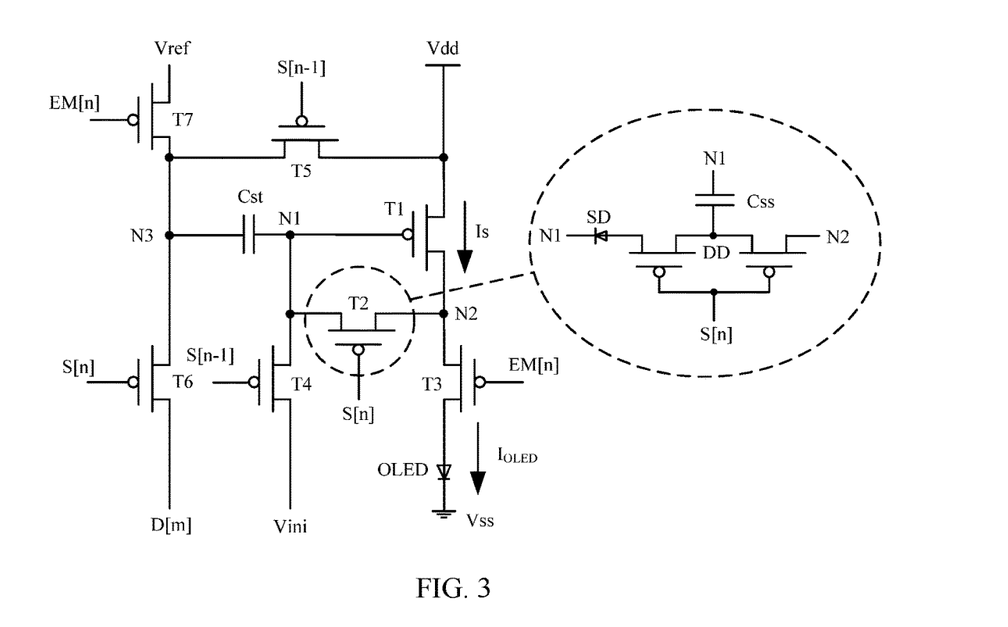
FIG. 3 is a circuit diagram of an example pixel circuit in the display device shown in FIG. 2 according to an embodiment of the present disclosure.

FIG. 3 is a circuit diagram of an example pixel circuit in the display device 100 shown in FIG. 2 according to an embodiment of the present disclosure. In FIG. 3, for the convenience of description, the pixel circuit is shown that is connected to the n-th scan line S[n] ("the first scan line"), the (n−1)-th scan line S[n−1] ("the second scan line"), the n-th light emission control line EM[n] and the m-th data line D[m].

A driving transistor T1 is connected in series with an organic light-emitting diode (OLED). In the example of FIG. 3, the driving transistor T1 has a gate connected to a first node N1, a drain connected to a second node N2, and a source connected to a first power supply voltage Vdd. As is known, the driving transistor T1 may generate a saturation current $Is=K(Vgs-Vth)^2$.

A dual-gate transistor T2 is coupled between the first node N1 and the second node N2 such that the driving transistor T1 forms a diode structure when the dual-gate transistor T2 is turned on. As indicated by the dotted circle in FIG. 3, the dual-gate transistor T2 includes two sub-transistors that are connected in series via a common terminal DD. The two sub-transistors each have a gate connected to the first scan line S[n].

The example pixel circuit further includes a leakage current suppression structure, which in some embodiments includes a capacitor Css coupled between the first node N1 and the common terminal DD. Additionally or alternatively, in some embodiments, the leakage current suppression structure may include a Schottky diode SD coupled between the first node N1 and the dual-gate transistor T2. As will be discussed later, the leakage current suppression structure can suppress a change in the driving current $I_{OLED}$ flowing through the OLED caused by a leakage current flowing through the dual-gate transistor T2.

The example pixel circuit of FIG. 3 further includes a storage capacitor Cst, a third transistor T3, a fourth transistor T4, a fifth transistor T5, a sixth transistor T6 and a seventh transistor T7.

The storage capacitor Cst has a first terminal connected to the first node N1 and a second terminal connected to a third node N3.

The third transistor T3 is connected between the driving transistor T1 and the OLED and has a gate connected to the light emission control line E[n]. Specifically, a first electrode of the third transistor T3 is connected to the drain of the driving transistor T1, and a second electrode of the third transistor T3 is connected to the anode (not shown) of the OLED. The cathode (not shown) of the OLED is connected to the second power supply voltage Vss.

The fourth transistor T4 has a gate connected to the second scan line S[n−1], a first electrode connected to an initialization voltage Vini, and a second electrode connected to the first node N1.

The fifth transistor T5 has a gate connected to the second scan line S[n−1], a first electrode connected to the first power supply voltage Vdd, and a second electrode connected to the third node N3.

The sixth transistor T6 has a gate connected to the first scan line S[n], a first electrode connected to the data line D[m], and a second electrode connected to the third node N3.

The seventh transistor T7 has a gate connected to the light emission control line EM[n], a first electrode connected to the reference voltage Vref, and a second electrode connected to the third node N3.

It will be understood that each of these transistors may be fabricated such that its first and second electrodes may be used interchangeably. Examples of the transistors include but are not limited to thin film transistors (TFTs).

Figure 4:
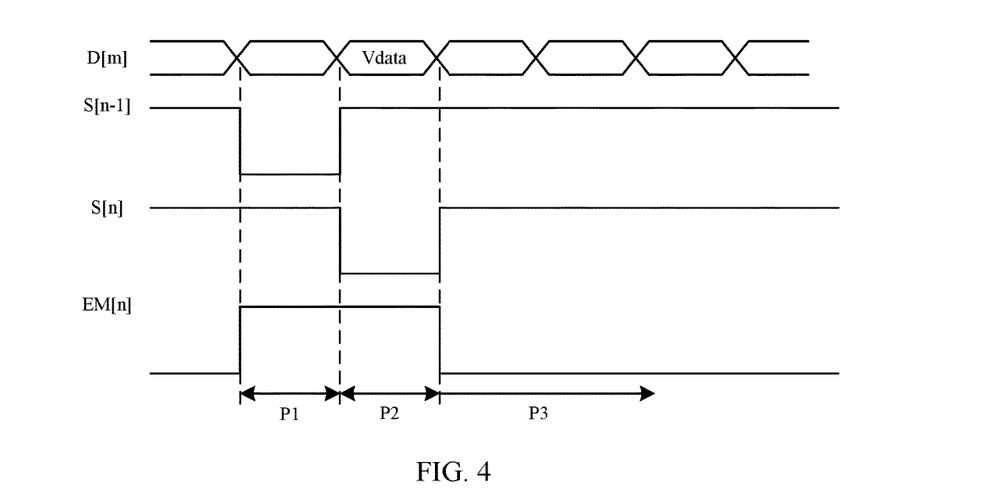
FIG. 4 is a timing diagram of the example pixel circuit of FIG. 3.

FIG. 4 is a timing diagram of the example pixel circuit of FIG. 3. The operation of the example pixel circuit of FIG. 3 is described below in conjunction with FIG. 4.

In phase P1 (initialization phase), the fourth transistor T4 initializes the voltage at the first node N1 to the initialization voltage Vini (a low-level voltage) in response to a second scan signal (a low-level signal) from the second scanning line S[n−1]. The driving transistor T1 is turned on so that the potential at the second node N2 is close to the first power supply voltage Vdd (a high-level voltage). The fifth transistor T5 initializes the voltage at the third node N3 to the first power supply voltage Vdd in response to the second scan signal.

In the absence of the capacitor Css, the common terminal DD of the dual-gate transistor T2 is floated, and thus the potential at the common terminal DD may be affected by external disturbance. In particular, the dual-gate transistor T2 will be turned on when $V_G-V_{DD}<Vth$ and $V_G-V_{N2}<Vth$, where $V_G$ is the potential at the gate of the dual-gate transistor T2, $V_{DD}$ is the potential at the common terminal DD, Vth is the threshold voltage of the dual-gate transistor, and $V_{N2}$ is the potential at the second node N2. In this case, an unintended turn-on of the dual-gate transistor T2 causes the potential at the first node N1 to rise. This may affect correct writing of the data voltage to the first node N1 in a subsequent phase.

In an embodiment where the capacitor Css is implemented, the potential at the common terminal DD is less affected by external disturbance due to the presence of capacitor Css. Therefore, improper writing of the data voltage caused by the unintended turn-on of the dual-gate transistor T2 may be alleviated or even eliminated.

In phase P2 (data write phase), the dual-gate transistor T2 causes the driving transistor T1 to form a diode structure in response to a first scan signal (a low-level signal) from the first scan line S[n], and the sixth transistor T6 write the data voltage Vdata from the data line D[m] to the third node N3 in response to the first scan signal. That is, $V_{N3}$=Vdata, where $V_{N3}$ is the potential at the third node N3.

In an embodiment where the Schottky diode SD is not implemented, Vds=Vth and Vg=Vd for the driving transistor T1. Then, the first node N1 is at a potential of $V_{N1}$=Vg=Vd=Vdd+Vds=Vdd+Vth. In an embodiment where the Schottky diode SD is implemented, Vds=Vth and Vg=Vd−$V_T$ for the driving transistor T1, where $V_T$ is the threshold voltage of the Schottky diode SD. Then, the first node N1 is at a potential of $V_{N1}$=Vg=Vd−$V_T$=Vdd+Vds−$V_T$=Vdd+Vth−$V_T$.

In phase P3 (light emission phase), the seventh transistor T7 transfers a reference voltage Vref to the third node N3 in response to a light-emitting control signal (a low-level signal) from the light emission control line EM[n]. The potential $V_{N3}$ of the third node N3 is changed from Vdata to Vref. Due to the self-boosting effect of the storage capacitor Cst, the potential $V_{N1}$ at the first node N1 changes accordingly.

In an embodiment where the Schottky diode SD is not implemented, $V_{N1}$ changes to Vdd+Vth+(Vref−Vdata). In an embodiment where the Schottky diode SD is implemented, $V_{N1}$ changes to Vdd+Vth−VT+(Vref−Vdata).

In this phase, the third transistor T3 is turned on in response to the light emission control signal and provides a current path along which the driving current $I_{OLED}$ flows through the OLED. In the example of FIG. 3, as indicated by the arrow, the current sequentially flows through the driving transistor T1, the third transistor T3 and the OLED along the current path. The OLED emits light with an intensity corresponding to the driving current $I_{OLED}$. As described above, the saturation current Is generated by the driving transistor T1 can be calculated as Is=K(Vgs−Vth)².

In the embodiment where the Schottky diode SD is not implemented, the following equation can be derived:

$$\begin{aligned} Is &= K(Vgs - Vth)^2 \\ &= K(Vg - Vs - Vth)^2 \\ &= K(V_{N1} - Vdd - Vth)^2 \\ &= K(Vdd + Vth + (Vref - Vdata) - Vdd - Vth)^2 \\ &= K(Vref - Vdata)^2 \end{aligned}$$

Advantageously, the saturation current Is is independent of the threshold voltage Vth of the driving transistor T1, thereby achieving compensation of the difference between the threshold voltages of different driving transistors due to the process.

However, this compensation effect can be adversely affected by the leakage current flowing through the dual-gate transistor T2. In the example circuit of FIG. 3, during the light emission phase, there may be a leakage current flowing from the first node N1 to the second node N2 through the dual-gate transistor T2 because the potential at the first node N1 (which is equal to Vdd+Vth+(Vref−Vdata)) can be significantly higher than the potential at the second node (which is close to the second power supply voltage Vss, being a low potential). This leakage current together with the saturation current Is of the driving transistor flows through the OLED, resulting in an increased driving current $I_{OLED}$. This can affect the display quality of the display device.

Advantageously, the change in the current $I_{OLED}$ caused by the leakage current can be compensated for due to the presence of the capacitor Css. This is a negative feedback process. Referring back to FIG. 3, when the leakage current flows from the first node N1 to the second node N2 through the dual-gate transistor T2 (and thus the $I_{OLED}$ increases), the potential at the second node N2 increases and the potential at the common terminal DD of the dual-gate transistor increases accordingly. Due to the self-boosting effect of the capacitor Css, the increase in the potential at the common terminal DD results in an increase in the potential $V_{N1}$ at the first node N1. According to the equation $Is=K(Vgs-Vth)^2=K(Vsg+V_{N1})^2$ (where $Vg=V_{N1}$), the saturation current Is decreases when Vg increases, thereby compensating for the increase in the current $I_{OLED}$ caused by the leakage current. In practice, this negative feedback will reach a dynamic balance, resulting in a stable driving current $I_{OLED}$. As a result, the change in the driving current of the OLED caused by the leakage current flowing through the dual-gate transistor T2 can be suppressed by the capacitor Css.

In an embodiment where the Schottky diode SD is implemented, the following equation can be derived:

$$Is = K(Vgs - Vth)^2$$
$$= K(Vg - Vs - Vth)^2$$
$$= K(V_{N1} - Vdd - Vth)^2$$
$$= K(Vdd + Vth - V_T + (Vref - Vdata) - Vdd - Vth)^2$$
$$= K(Vref - Vdata - V_T)^2$$

Similarly, the saturation current Is is independent of the threshold voltage Vth of the driving transistor T1, except that the saturation current Is is now related to the threshold voltage $V_T$ of the Schottky diode SD. In some embodiments, the term $V_T$ may be canceled out in the above equation by introducing an equal value in the data voltage during the data write phase P2 by the data driver.

As shown in FIG. 3, the Schottky diode SD is arranged to be reversely turned off to suppress the leakage current flowing through the dual-gate transistor T2 during the light emission phase P3. Specifically, in the example circuit of FIG. 3, the Schottky diode SD is coupled between the first node N1 and the dual-gate transistor T2, with its positive electrode connected to the dual-gate transistor T2 and its negative electrode connected to the first node N1. Due to the one-way conduction characteristic of the diode, the leakage current is refrained from flowing from the first node N1 to the second node N2. Therefore, the change in the driving current of the OLED caused by the leakage current flowing through the dual-gate transistor T2 can be suppressed by the Schottky diode SD.

In an embodiment where both the Schottky diode SD and the capacitor Css are realized, the advantages described above in connection with embodiments where the capacitor Css is realized can also be obtained and is not detailed here.

Although the pixel circuit embodiments of the present disclosure have been described above with reference to FIGS. 3 and 4, it will be understood that the pixel circuit is exemplary and that the present disclosure is not limited thereto.

Figure 5:
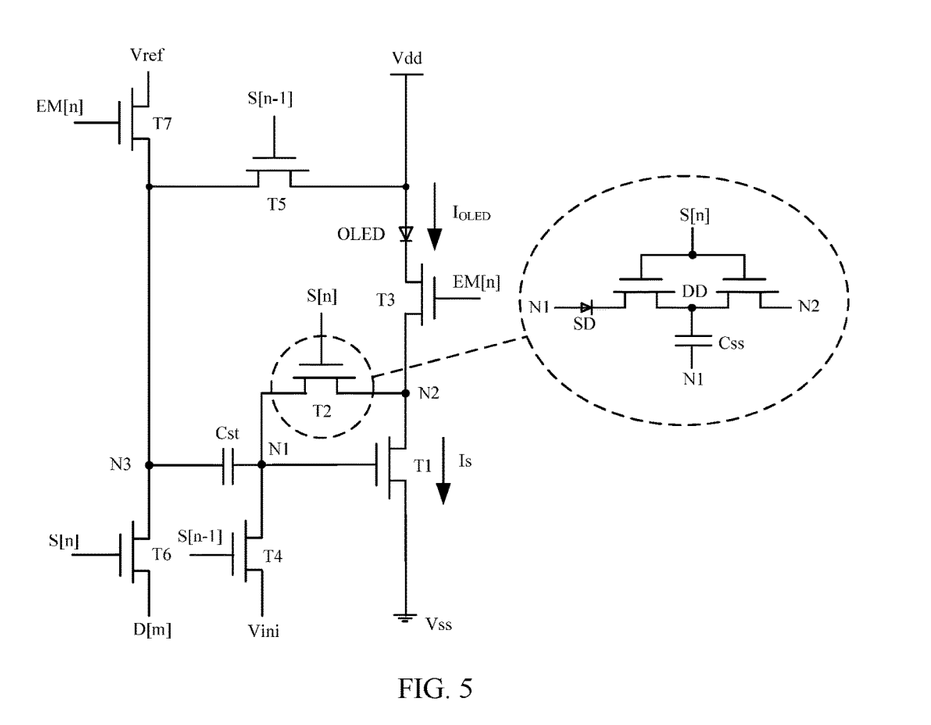
FIG. 5 is a circuit diagram of another example pixel circuit according to an embodiment of the present disclosure.

FIG. 5 is a circuit diagram of another example pixel circuit according to an embodiment of the present disclosure, in which each of the transistors is an N-type transistor. As is known, an N-type transistor is turned on in response to a high-level voltage and is turned off in response to a low-level voltage. The example circuit of FIG. 5 and its operation are similar to those already described in relation to FIGS. 3 and 4, and thus will not be detailed here. Other pixel circuits are also possible in other embodiments.

Figure 6A:
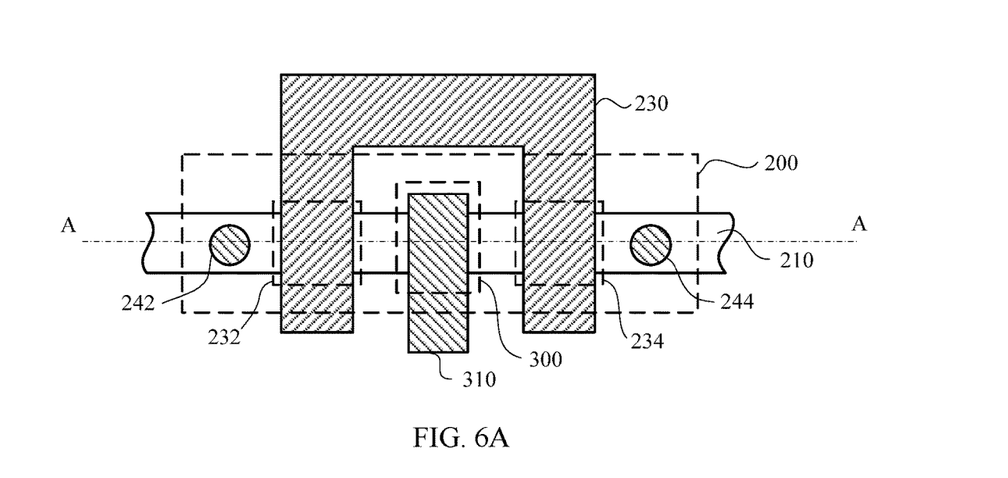
FIG. 6A is a plan view illustrating an example layout design of a dual-gate transistor and an associated capacitor in a pixel circuit in accordance with an embodiment of the disclosure.

FIG. 6A illustrates an example layout design of a dual-gate transistor and an associated capacitor in a pixel circuit in accordance with an embodiment of the disclosure. A structure 200, which may be the dual-gate transistor T2 shown in FIG. 3, and a structure 300, which may be the capacitor Css shown in FIG. 3, are shown in FIG. 6A as indicated by the dashed boxes.

The dual-gate transistor structure 200 includes an active layer 210, a gate metal layer 230, a first electrode 242 and a second electrode 244. The gate metal layer 230 includes two gate metal regions 232, 234 overlapping the active layer 210. The gate metal regions 232, 234 are spaced apart from and electrically connected to each other, serving as the gates of the two sub-transistors in the dual-gate transistor, respectively. The capacitor structure 300 includes a metal plate 310.

Figure 6B:
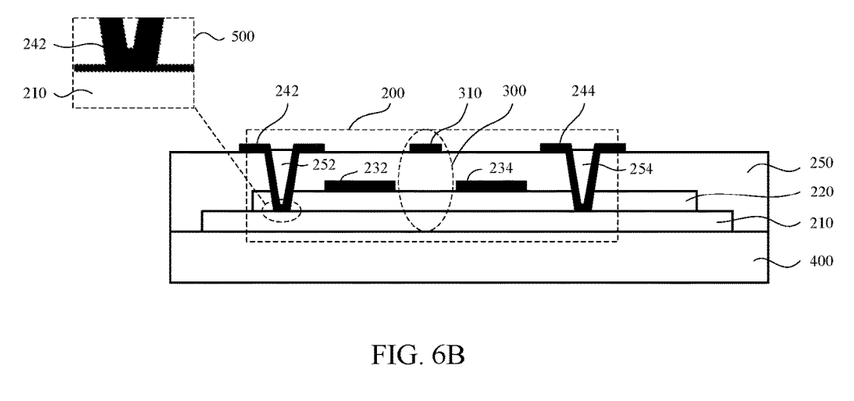
FIG. 6B is a cross-sectional view taken along line A-A of FIG. 6A.

FIG. 6B is a cross-sectional view taken along line A-A of FIG. 6A, in which exemplary details of the dual-gate transistor structure 200 and the capacitor structure 300 are shown more clearly.

As shown in FIG. 6B, the active layer 210 is arranged on a substrate 400. In some embodiments, the active layer 210 may be made of polysilicon although this is not necessary. The dual-gate transistor structure 200 further includes an insulation layer 220 arranged on the active layer 210. The two gate metal regions 232, 234 of the gate metal layer 230 are arranged on the insulation layer 220. The dual-gate transistor structure 200 may further be provided with an interlayer dielectric (ILD) layer 250 covering the insulation layer 220 and the gate metal layer 230 (and thus the gate metal regions 232, 234) to provide better insulation for the semiconductor circuit, for example. Both the first electrode 242 and the second electrode 244 are in electrical contact with the active layer 210, with the first electrode 242 being the electrode of a dual-gate transistor connected to the first node and the second electrode 244 being the electrode of the dual-gate transistor connected to the second node. In the example of FIG. 6B, the first electrode 242 and the second electrode 244 extend along a first via 252 and a second via 254 that pass through the ILD layer 250 and the insulation layer 220, respectively, to achieve the electric connection with the active layer 210.

The metal plate 310 of the capacitor structure 300 is arranged such that the insulation layer 220 is sandwiched between the metal plate 310 and the active layer 210. The metal plate 310 and the portion of the active layer 210 opposite to the metal plate 310 act as two plates of the capacitor structure 300. At least the insulation layer 220 is filled between the two plates so that the capacitor structure 300 has a charge storage capacity. In the example of FIG. 6B, the metal plate 310 is arranged on the ILD layer 250 and thus is located on a different layer than the gate metal layer 230. In this case, the metal plate 310 may be made of a different metal material than the gate metal layer 230 although this is not necessary. In other embodiments, the metal plate 310 may be arranged in other ways. For example, the metal plate 310 may be arranged inside the ILD layer 250 and at a different layer than the gate metal layer 230.

A Schottky diode structure 500 is also shown in FIG. 6B. The Schottky diode structure 500 includes a hole blocking layer (not shown) formed by the metal-semiconductor contact between the first electrode 242 and the active layer 210 (e.g., polysilicon). In some embodiments, the first electrode 242 may be made of a metal such as Ag, Au, Pt, or Al. In other embodiments, the first electrode 242 may be made of any other suitable metal.

As is known, when the polysilicon is doped to a certain concentration, the doped polysilicon and the metal (e.g., Ag) will have different Fermi levels due to their different work functions such that the metal-semiconductor contact between the polysilicon and the metal forms a hole blocking layer, i.e., a Schottky junction. This junction has a low threshold voltage and similar reversely turned-off capability with a PN junction. This reversely turned-off capability can facilitate reduction of the leakage current due to the potential difference between the first node N1 and the second node N2.

Although the capacitor structure 300 and the Schottky diode structure 500 that are associated with the dual-gate transistor structure have been described above with reference to FIGS. 6A and 6B, it is to be understood that these structures are exemplary and that the present disclosure is not limited thereto.

Figure 7A:
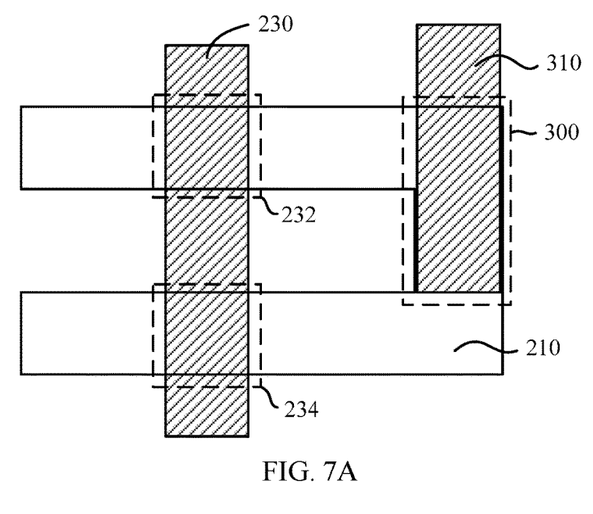
FIGS. 7A and 7B are plan views illustrating additional example layout designs of a dual-gate transistor and an associated capacitor in a pixel circuit according to an embodiment of the present disclosure.
Figure 7B:
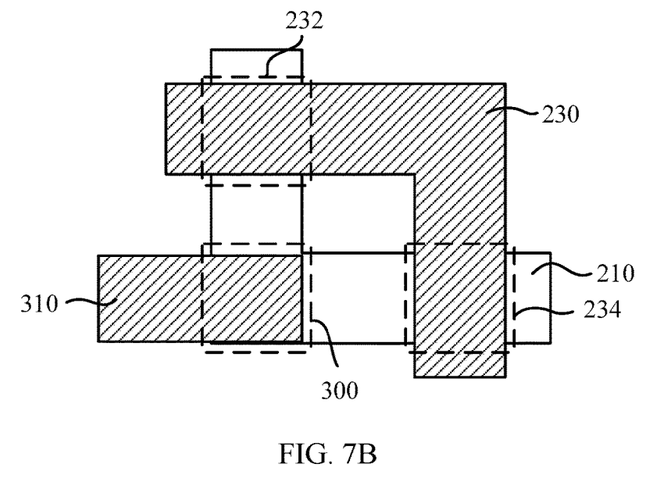

FIGS. 7A and 7B show additional example layout designs of the dual-gate transistor and the associated capacitor. In these designs, the capacitor structure 300 is not located between the gate metal regions 232, 234 when viewed from above, and therefore can be designed with a certain degree of freedom. For example, the metal plate 310 of the capacitor structure 300 may be located at the same layer as the gate metal layer 230, as indicated by the hatchings. In this case, both of them may be made of the same metal material so as to be formed, for example, in a one-time patterning process. In other embodiments, the capacitor structure associated with the dual-gate transistor structure may be implemented in other suitable ways.

According to the embodiments, by employing the leakage current suppression structure, it may be possible to suppress the variation of the driving current of the OLED caused by the leakage current flowing through the dual-gate transistor. In embodiments where the leakage current suppression structure includes a capacitor coupled between the first node and the common terminal of the dual-gate transistor, the capacitor may further facilitate reduction of adverse effects of external disturbances on the operation of the dual-gate transistor.

Variations to the disclosed embodiments can be understood and effected by the skilled person in practicing the claimed subject matter, from a study of the drawings, the disclosure, and the appended claims. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A pixel circuit comprising:
an organic light-emitting diode;
a driving transistor connected in series with the organic light-emitting diode and configured to drive the organic light-emitting diode to emit light by means of a driving current flowing through the organic light-emitting diode during a light emission phase, wherein the driving transistor has a gate connected to a first node and a drain connected to a second node;
a dual-gate transistor coupled between the first node and the second node to cause the driving transistor to form a diode structure when the dual-gate transistor is turned on, wherein the dual-gate transistor comprises two sub-transistors connected in series via a common terminal; and
a leakage current suppression structure for suppressing a change in the driving current caused by a leakage current flowing through the dual-gate transistor, wherein the leakage current suppression structure comprises at least one of a capacitor coupled between the first node and the common terminal or a Schottky diode coupled between the first node and the dual-gate transistor, wherein the Schottky diode is arranged to be reversely turned off to suppress flowing of the leakage current through the dual-gate transistor during the light emission phase.

2. The pixel circuit of claim 1, wherein the dual-gate transistor comprises:
an active layer;
an insulation layer arranged on the active layer;
a gate metal layer arranged on the insulation layer and comprising two gate metal regions spaced apart from and electrically connected to each other;
a first electrode in electrical contact with the active layer and connected to the first node; and
a second electrode in electrical contact with the active layer and connected to the second node.

3. The pixel circuit of claim 2, wherein the capacitor comprises a metal plate arranged such that the insulation layer is sandwiched between the metal plate and the active layer.

4. The pixel circuit of claim 3, wherein the metal plate is located in a different layer than the gate metal layer.

5. The pixel circuit of claim 3, wherein the metal plate is located in a same layer as the gate metal layer.

6. The pixel circuit of claim 2, wherein the first electrode is made of a metal, and wherein the Schottky diode comprises a hole blocking layer formed by metal-semiconductor contact between the first electrode and the active layer.

7. The pixel circuit of claim 6, wherein the active layer is made of polysilicon, and wherein the metal is selected from the group consisting of Ag, Au, Pt, and Al.

8. The pixel circuit of claim 1, wherein the two sub-transistors each have a gate connected to a first scan line, and wherein the pixel circuit further comprises:
a storage capacitor having a first terminal connected to the first node and a second terminal connected to a third node;
a third transistor connected between the driving transistor and the organic light-emitting diode and having a gate connected to a light emission control line;
a fourth transistor having a gate connected to a second scan line, a first electrode connected to an initialization voltage, and a second electrode connected to the first node;
a fifth transistor having a gate connected to the second scan line, a first electrode connected to a first power supply voltage, and a second electrode connected to the third node;
a sixth transistor having a gate connected to the first scan line, a first electrode connected to a data line, and a second electrode connected to the third node; and
a seventh transistor having a gate connected to the light emission control line, a first electrode connected to a reference voltage, and a second electrode connected to the third node.

9. The pixel circuit of claim 8, wherein the fourth transistor is configured to initialize a potential at the first node to the initialization voltage in response to a second scan signal from the second scan line, and wherein the fifth transistor is configured to initialize a potential at the third node to the first power supply voltage in response to the second scan signal.

10. The pixel circuit of claim 8, wherein the dual-gate transistor is configured to cause the driving transistor to form the diode structure in response to a first scan signal from the first scan line, and wherein the sixth transistor is configured to write a data voltage from the data line to the third node in response to the first scan signal.

11. The pixel circuit of claim 8, wherein the seventh transistor is configured to transfer the reference voltage to the third node in response to a light emission control signal from the light emission control line, and wherein the third transistor is configured to, responsive to the light emission control signal, provide a current path along which the drive current flows through the organic light-emitting diode.

12. A display device comprising:
a pixel array comprising a plurality of pixel circuits;
a first scan driver configured to supply scan signals to the pixel array;
a second scan driver configured to supply light emission control signals to the pixel array; and
a data driver configured to supply data signals to the pixel array,
wherein each of the plurality of pixel circuits comprises:
an organic light-emitting diode;
a driving transistor connected in series with the organic light-emitting diode and configured to drive the organic light-emitting diode to emit light by means of a driving current flowing through the organic light-emitting diode during a light emission phase, wherein the driving transistor has a gate connected to a first node and a drain connected to a second node;
a dual-gate transistor coupled between the first node and the second node to cause the driving transistor to form a diode structure when the dual-gate transistor is turned on, wherein the dual-gate transistor comprises two sub-transistors connected in series via a common terminal; and
a leakage current suppression structure for suppressing a change in the driving current caused by a leakage current flowing through the dual-gate transistor, wherein the leakage current suppression structure comprises at least one of a capacitor coupled between the first node and the common terminal or a Schottky diode coupled between the first node and the dual-gate transistor, wherein the Schottky diode is arranged to be reversely turned off to suppress flowing of the leakage current through the dual-gate transistor during the light emission phase.

13. The display device of claim 12, wherein the dual-gate transistor comprises:
an active layer;
an insulation layer arranged on the active layer;
a gate metal layer arranged on the insulation layer and comprising two gate metal regions spaced apart from and electrically connected to each other;
a first electrode in electrical contact with the active layer and connected to the first node; and
a second electrode in electrical contact with the active layer and connected to the second node.

14. The display device of claim 13, wherein the capacitor comprises a metal plate arranged such that the insulation layer is sandwiched between the metal plate and the active layer.

15. The display device of claim 14, wherein the metal plate is located on a different layer than the gate metal layer.

16. The display device of claim 14, wherein the metal plate is located in a same layer as the gate metal layer.

17. The display device of claim 13, wherein the first electrode is made of a metal, and wherein the Schottky diode comprises a hole blocking layer formed by metal-semiconductor contact between the first electrode and the active layer.

18. The display device of claim 17, wherein the active layer is made of polysilicon, and wherein the metal is selected from the group consisting of Ag, Au, Pt, and Al.

* * * * *